United States Patent [19]

Gloaguen et al.

[11] Patent Number: 4,612,460
[45] Date of Patent: Sep. 16, 1986

[54] CIRCUIT FOR TRANSLATING SIGNAL LEVELS BETWEEN A LOGIC OF THE SATURATED TYPE AND A LOGIC OF THE NON-SATURATED TYPE

[75] Inventors: Gilbert Y. M. Gloaguen, Tourville sur Odon; Michel Moussie, Caen, both of France

[73] Assignee: U.S. Philips Corporation, New York, N.Y.

[21] Appl. No.: 541,946

[22] Filed: Oct. 14, 1983

[30] Foreign Application Priority Data

Oct. 18, 1982 [FR] France .................. 82 17397

[51] Int. Cl.⁴ .................. H03K 19/092; H03K 19/003
[52] U.S. Cl. .................. 307/475; 307/443; 307/446; 307/455
[58] Field of Search ............... 307/443, 446, 455, 475

[56] References Cited

U.S. PATENT DOCUMENTS

| 3,648,064 | 3/1972 | Mukai et al. | 307/446 X |
| 3,716,722 | 2/1973 | Bryant et al. | 307/443 |
| 3,959,666 | 5/1976 | Fett et al. | 307/475 |
| 3,986,045 | 10/1976 | Lutz | 307/475 |
| 4,456,838 | 6/1984 | Taguchi et al. | 307/475 X |
| 4,477,740 | 10/1984 | Takeda | 307/475 X |
| 4,518,876 | 5/1985 | Constantinescu | 307/475 |

Primary Examiner—Larry N. Anagnos
Attorney, Agent, or Firm—Thomas A. Briody; Jack Oisher; William J. Streeter

[57] ABSTRACT

A circuit for translating signal levels between a logic family type circuit (11) of, for example, the TTL type, and a second logic family type circuit of, for example, the ECL/CML type (12) of, for example, the ECL/CML type, in which a transit terminal (22) receives the output signals of the first logic circuit in order to translate them into input signals for the second logic circuit.

The translator circuit comprises a transistor (T1) whose base is connected to a first point (P1) at a chosen potential, which may be common ground (M), via a first forward junction (J1), and is further connected to the transit terminal (22) by a series arrangement (23) of a resistor (R1) and a second junction (J2). The circuit further has a current source (S1) connected between the supply voltage source and the emitter of the transistor T1, and a load element (Z) for the current source (S1) connected to the emitter of the transistor T1 and to a second point (P2) at a chosen potential, which may be the common ground return. One output level of the translator circuit is determined by the voltage drop in the element (Z) traversed by the current of (S1) when the transistor (T1) is cut off, while the other level is determined by the voltage at the emitter of (T1) when it is conducting.

12 Claims, 5 Drawing Figures

CIRCUIT FOR TRANSLATING SIGNAL LEVELS BETWEEN A LOGIC OF THE SATURATED TYPE AND A LOGIC OF THE NON-SATURATED TYPE

BACKGROUND OF THE INVENTION

1. Field of the Invention

The invention relates to a circuit for translating signal levels between on the one hand a first logic family type circuit of the saturated type characterized by having two output signal levels and which is driven, by a first d.c. supply source one of the terminals of which constitutes a common potential reference point, and on the other hand a second logic family type circuit of the non-saturated type characterized by having two output signal levels and which is driven by a second d.c. supply source one of the terminals of which is connected to the common potential reference point and the other terminal of which is connected to a voltage having a polarity opposite to that of the first d.c. supply source. The output signals of the first logic circuit are received at a transit terminal of the translator, and are translated into signals, at an output terminal of the translator, at suitable levels for the input to the second logic circuit.

2. Description of the Related Art

In apparatus for processing digital signals, and especially in the modern computers, it is necessary to translate signals having levels corresponding to those of TTL logic (or an equivalent logic) into signals adapted to logic of the ECL/CML type, and conversely.

TTL type logic is commonly used in logic circuits in which low consumption is required and switching speed is not of major importance. For example, in peripheral elements of a computer. However logic of the ECL/CML type in the current switching mode operates at higher speed due to the absence of saturation and the reduced difference or deviation between logic levels. It is therefore utilized advantageously in the central elements of a computer where digital data must be processed at very high speed.

Consequently, it is desirable to be able to translate the signals between these different types of logic circuit whilst ensuring that the optimum transfer conditions are obtained: in fact predetermined switching levels have to be obtained in the presence of a given noise level over a large temperature range, in the presence of supply fluctuations. Otherwise, in addition to the criteria of electrical nature there are technological considerations, as the ease of integration of these translator circuits, the required number of elements and hence their complexity and also their sensitivity to the inevitable fluctuations associated with the methods of manufacture.

A translator circuit of the kind described in the preamble is disclosed in U.S. Pat. No. 3,959,666.

In the known circuit, it is found that the voltage at the switching level does not exhibit the desired variability as a function of temperature, that is to say a variability corresponding to two direct voltage drops of semiconductor junctions, as is the case for a logic of the TTL type. As a result, the noise immunity of such a circuit cannot satisfy the standard requirements over the whole range of usually specified temperatures.

Furthermore, the known circuit makes use of a Schottky diode in parallel with the base-collector junction of a transistor so that saturation of the transistor is avoided. The integration of this type of diode can be effected when the translator circit is constructed according to TTL technology, but can become impossible where contrary, the circuit is constructed according to CML technologies.

Of course, attempts can be made to eliminate the Schottky diode or to replace it by an anti-saturation transistor. In the first alternative, the saturation of the transistor leads to a loss of speed which is not acceptable. In the second alternative, the diode is replaced by a transistor to which supplementary resistors have to be added so that the circuit then requires a comparatively large number of components to obtain the desired switching speed.

SUMMARY OF THE INVENTION

The invention has especially for its object to obviate the disadvantages of the known circuits.

A first object of the invention is to maintain a satisfactory adaptation between the signal levels of the two logics over a large operating temperature range.

Another object of the invention is to provide a translator circuit of simple structure, whose elements can be integrated with a complex function of the second logic and defined according to the same technological rules.

In fact, according to the invention, a circuit for translating signal levels of the kind described above is especially characterized in that it comprises:

an emitter follower transistor the base of which is connected on the one hand to a first point of the circuit at a given potential with respect to that of the common reference point via a first semiconductor junction in forward direction and on the other hand to the transit terminal via a current-limiting element, a constant current source arranged between the said other terminal of the second supply source and the emitter of the emitter follower transistor, a load element for the constant current source, of which a first connection is connected to the emitter of the emitter follower transistor and of which a second connection is connected to a second point of the circuit at a given potential with respect to that of the common reference point, and in that the said first connection of the load element constitutes the output terminal of the translator carrying the signals for the input of the second logic, one level of these signals being determined on the basis of the potential of the said second point of the circuit by the voltage drop in the load element traversed by the current of the constant current source, the emitter follower transistor being cut off, while the other level is determined by the potential of the emitter of the emitter follower transistor, the latter then being conducting.

The expression "point of the circuit at a given potential with respect to that of the common reference point" is to be understood to mean the common reference point itself or a point of which the potential differs from that of the common reference point by a stable value, as that, for example, of a voltage drop of a semiconductor junction in forward direction. The expression "load element for the current source" is to be understood to mean any element, such as a resistor, a diode or a transistor, which produces a suitable voltage drop when it is traversed by the current supplied by the constant current source. The expression "semiconductor junction" is to be understood to mean not only a diode, but also, and preferably, a transistor connected such as to function as a diode, that is to say whose base and collector are connected to each other and constitute one of the output electrodes, the emitter constituting the other electrode.

The transistor circuit according to the invention has the advantage of being constituted by a restricted number of elements which can be easily integrated within the said second logic circuit. The translator circuit does not comprise a terminal of the first d.c. supply source, such as the $+V_{CC}$, in the case in which the first logic circuit is of the TTL type.

The potentials lying between the terminals of the first d.c. supply source are supplied to the translator circuit only through the transit terminal. Thus, a saving in the number of pins of an integrated circuit of the second logic circuit incorporating such a translator is obtained.

Finally, and as will be set out in detail hereinafter, the deviations between the levels of the input and output signals of the translator circuit can be kept compatible over a very large temperature range.

In a first embodiment of the invention, the said first and second points of the circuit at a given potential are connected to the common reference point, and the collector of the emitter follower transistor is connected to one of the junction points of the said series arrangement.

By way of example, if the series arrangement is constituted successively, from the transit terminal, by a limiter resistor and a supplementary semiconductor junction, the collector of the emitter follower transistor can be connected at will either directly to the transit terminal, or to the junction point between the limiter resistor and the supplementary semiconductor junction, or directly to the base of the same transistor. The order of succession of the elements of the series arrangement may also be inverted, without reducing the choices available for the connection of the collector.

As will be seen in detail hereinafter, the value of the limiter resistor has to be chosen differently depending upon whether the collector current of the emitter follower transistor does or does not flow through this resistor.

In this very simple embodiment, the transit terminal, which supplies the control signals for the base of the emitter follower transistor, also supplies the collector current of this transistor.

The first embodiment of the invention comprises a particular modification, according to which an additional limiter resistor is included in the said series arrangement between the junction point to which the collector of the emitter follower transistor is connected and the base of the said transistor. This modification has the advantage of reducing the current supplied by the transit terminal.

In a second embodiment of the invention, the translator circuit is characterized in that the said first point of the circuit is connected to a first electrode of an associated semiconductor junction, whose second electrode is connected to the common reference point, an associated current source further being connected between the first electrode of the associated semiconductor junction and the said other terminal of the second supply source, which subjects the associated semiconductor junction to a forward current, and in that the said series arrangement comprises two supplementary semiconductor junctions.

This embodiment consequently consists in that the control of the base of the emitter follower transistor is shifted by the value of a forward voltage drop of a semiconductor junction with respect to the first embodiment. As a result, the collector of the emitter follower transistor can then be advantageously connected to the common reference point. The collector current is then supplied by the common reference point and no longer by the transit terminal, as a result of which the current consumption at this terminal is reduced.

A particularly advantageous modification of the second embodiment of the invention, which, however, may also be used in the first embodiment, consists in that an additional current source, especially an additional base resistor, is connected between the base of the emitter follower transistor and the said other terminal of the second supply source. This additional current source, which is chosen to supply a weak current with respect to that supplied by the said constant current source, permits of adjusting the influence of the amplification of the emitter follower transistor on the operation of the translator circuit to the point at which this influence becomes negligible.

According to a first modification of the second embodiment of the invention, the said second point of the circuit at a given potential is connected to the said first point.

According to a second modification of the same embodiment, the load element is constituted by a transistor of the same polarity as the emitter follower transistor, which is referred to hereinafter as load transistor and the emitter of which constitutes the said first connection, while its base constitutes the said second connection subjected to the potential of one of the internal levels of the second logic and its collector is connected to the common reference point.

Such a modification can be advantageously used in the case of a translator circuit in which the transit terminal can moreover receive for transfer to the first logic signals originating from an output circuit of the second logic comprising a first long-tailed pair of transistors connected as an "OR" gate for controlling a first transistor of a second long-tailed pair of transistors, characterized in that one of the bases of the first pair of transistors constitutes a first selection conversion input, the other base of the same pair receiving the signals of the second logic, in that the connection to the common reference point of the collector of the first transistor of the second pair includes a semiconductor junction which constitutes the said associated semiconductor junction, while a current source feeding the second pair constitutes the said associated current source, in that the collector of the second transistor of the second pair is connected to the common reference point through a forward semiconductor junction and on the other hand to the transit terminal, and in that the base of the load transistor constitutes a second mode selection input complementarily controlled with respect to the first selection input. Such a translator circuit can consequently be used for the bidirectional translation of the signals between the two logics with the use of only one transit terminal.

BRIEF DESCRIPTION OF THE DRAWINGS

In order that the invention may be readily carried out, it will now be described more fully, by way of example, with reference to the accompanying drawings, in which.

DESCRIPTION OF THE PREFERRED EMBODIMENTS

Figure 1:
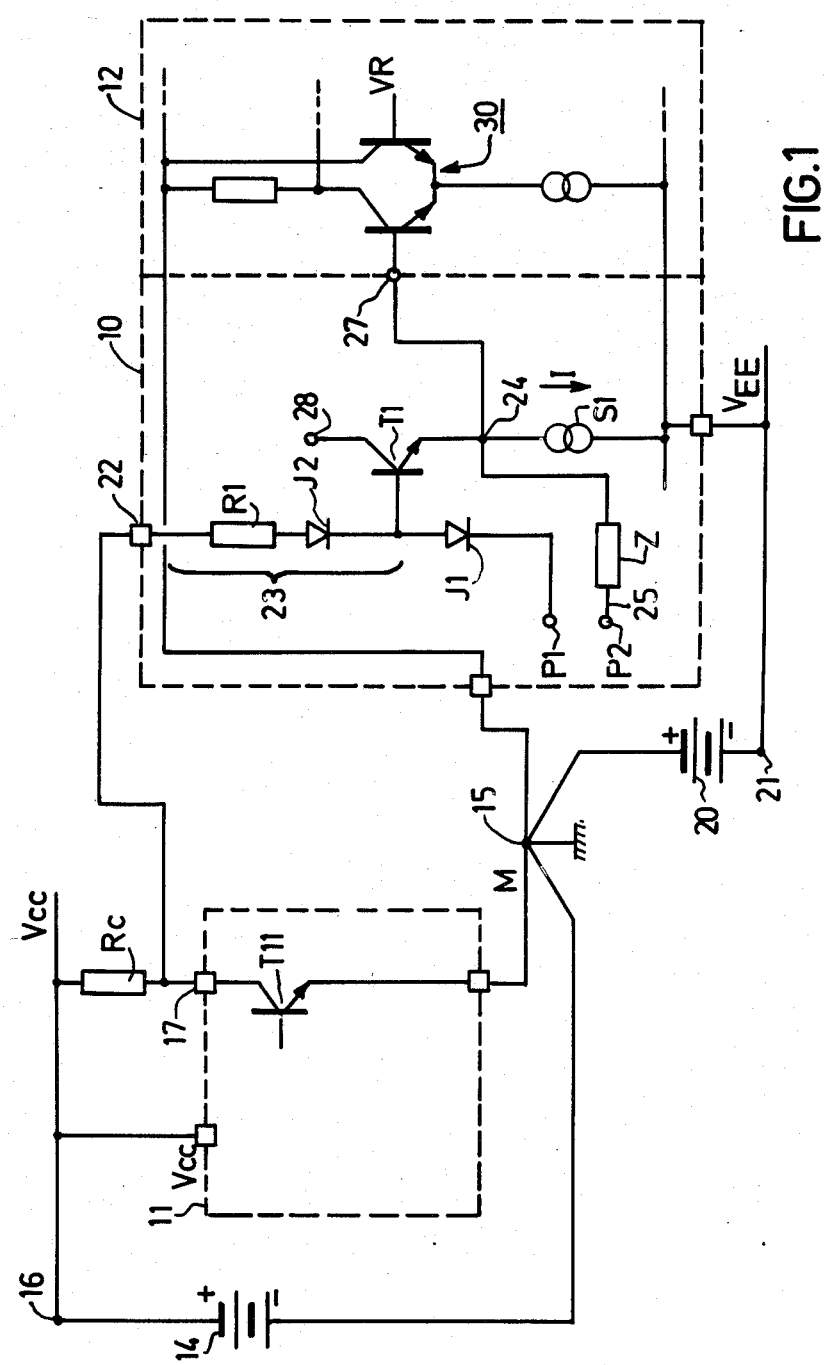
FIG. 1 shows a general electric circuit diagram of the translator circuit according to the invention as well as its main connections to the first and second logics.

In FIG. 1, the translator circuit 10 is represented by a general circuit diagram enclosed by broken lines. A circuit 11 of a first logic family of circuits of the saturated type, for example TTL, is fed from a first d.c. supply source 14, the negative terminal 15 of which constitutes the common reference potential point M. The potential generally designated by $V_{CC}$ is supplied by the positive terminal 16 of the supply source 14. A circuit 12 of a second logic family of circuits of the non-saturated type, for example ECL or CML, is delimited by broken lines indicated by 12, which broken lines in the Figure are affixed to the translator circuit 10, due to the fact that the circuits 10 and 12 are preferably integrated simultaneously in the same semiconductor body. The second logic circuit 12 is fed by a second d.c. supply source 20, the positive terminal of which is connected to the common reference potential point M. The potential generally designated by $V_{EE}$ is supplied by the negative terminal 21 of the supply source 20. The output signals of the first logic circuit 11 are present at the output terminal 17, which is connected to the potential $V_{CC}$ through a resistor $R_C$ externally of the circuit 11, which resistor serves as a load for the collector of a transistor T11 at the output of the circuit 11.

The output terminal 17 is connected to a transit terminal 22 forming part of the translator circuit 10. The translator circuit 10 comprises an emitter follower transistor T1, whose base is connected on the one hand to a first point P1 of the circuit 10 at a given potential with respect to that of the common reference point M through a first semiconductor junction J1 connected in forward direction, while this base is connected on the other hand to the transit terminal 22 through a series arrangement 23 comprising especially a current-limiting resistor R1 and at least one supplementary semiconductor junction J2 connected in forward direction. For the sake of clarity of the Figure, the semiconductor junctions J1 and J2 have been represented as diodes, but it will be clear that for those skilled in the art it is advantageous to use as semiconductor junctions J1 and J2 transistors connected as diodes. This remark also includes other semiconductor junctions which will be referred to hereinafter.

The translator circuit 10 further comprises a constant current source S1 of conventional structure especially according to the ECL/CML technique connected between $V_{EE}$ and the emitter of the emitter follower transistor T1. The constant current source S1 supplies a current having a value I.

The translator circuit 10 finally comprises a load element Z, of which a first connection 24 is connected to the emitter of the emitter follower transistor T1 and of which a second connection 25 is connected to a second point P2 of the circuit 10 at a given potential with respect to that of the common reference point M.

The output terminal 27 of the translator circuit 10 is common to the first connection node 24 of the load element Z. The output terminal 27 carries the signals for the input of the second logic circuit 12. The low level of these signals is determined on the basis of the potential of the second point P2 by the voltage drop in the load element Z traversed by the current I, the emitter follower transistor T1 being cut off in response to a low level of the potential at transit terminal 22, while the high level of the signals carried by the output terminal 27 is determined by the potential of the emitter of the emitter follower transistor T1 when the latter is conducting in response to a high level of the potential at transit terminal 22. The high level of the potential at output terminal 27 corresponds very accurately to the potential of the first point P1, because the semiconductor junction J1 substantially balances the voltage $V_{BE}$ of the emitter follower transistor T1.

As will be described hereinafter, the terminal 28 of the collector of the transistor T1 can be connected to one or the other suitable junction point of the circuit 10 depending upon the conditions, which junction point is chosen so that in the conducting state the transistor T1 can emit an emitter current having a value substantially equal to I, whilst avoiding saturation.

As to the second logic circuit 12, for simplicity only a differential input stage 30 thereof is shown, for which the signal carried by the terminal 27 is applied to one of the input bases, the other base being brought to a reference potential $V_R$. The structure of the circuit of the second logic circuit 12 is known in the prior art, especially for logic of the ECL/CML type, and does not constitute subject matter of the invention.

Figure 2:
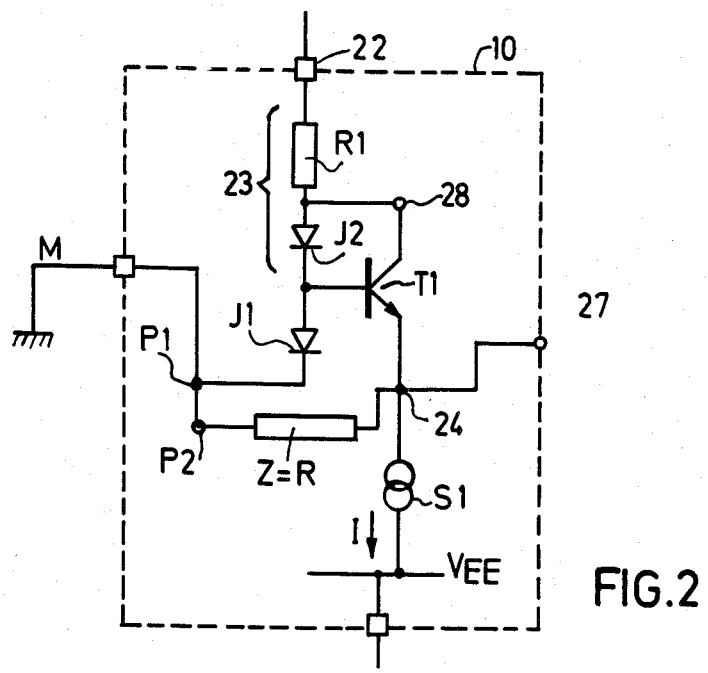
FIG. 2 shows an electric circuit diagram of the translator circit according to a first embodiment of the invention.

FIG. 2 shows the electric circuit diagram of the translator circuit 10 of FIG. 1, in which the corresponding elements are denoted by like reference symbols, and constitutes a first embodiment of the invention. The circuit diagram of FIG. 2 is distinguished from the corresponding parts of FIG. 1 by the following connections: the points P1 and P2 are connected together to the common reference point M and the terminal 28 of the collector of the transistor T1 is connected to the series arrangement 23 at the conductor which connects the resistor R1 and the semiconductor junction J2 to each other. Further, in this embodiment, the load element Z is constituted by a resistor having a value R.

The operation of the translator circuit 10 of FIG. 2 is explained whilst first assuming that the transit terminal 22 is in the low state. For a TTL logic family type circuit, for example, this means that the potential of the transit terminal 22 is at a potential lower than about +0.4 V. As can be deduced from FIG. 1, this low level is determined in that in first logic circuit 11 the transistor T11 loaded by the resistor $R_C$ is driven into saturation. In these conditions, in FIG. 2 the transistor T1 is cut off and the current I traverses the load element Z=R producing at the terminal 27 a low potential state whose potential is equal to: (O-RI) volt. R and I are chosen arbitrarily so that their product leads to a voltage drop of a value equal to the voltage deviation desired at the input of the circuit of the second logic 12. For example, I is chosen=0.5 mA and R is chosen≈800Ω for a logic of the CML type whose voltage deviation is approximately 0.4 V. R could equally well be chosen to be≈1.6 kΩ in the case of an input of an ECL logic whose input voltage deviation is approximately 0.8 V. It can now be simply shown that in the low state of the transit terminal 22 the voltage drop between this terminal and the terminal 27 is insufficient to render the transistor T1 conducting.

It will now be assumed that the potential of the transit terminal 22 is increased until, the transistor T1 being rendered conducting, it emits a current at its emitter having a value equal to I/2. The load element is also traversed by a current having a value I/2 originating from the constant current source S1. The potential $V_T$, which is then attained at the transit terminal 22, will be defined arbitrarily as the switching level of the first logic, while the potential attained at the output terminal 27 of the translator will be defined as the switching level of the second logic. $V_T$ can be evaluated approximately by means of the expression (1):

$V_T \simeq R1.I/2 + V_{J2} + V_{BE}(T1) - R.I/2$, in which the value of the base current has been neglected with respect to the values of the emitter and collector currents of the transistor T1, which values are chosen to be equal to each other. In the expression (1), $V_{J2}$ designates the forward voltage drop in the semiconductor junction J2, whilst $V_{BE}(T1)$ designates the voltage drop of the transistor T1 in the emitter-base junction. It will be seen immediately that, when R1 is chosen to be =R, the switching level of the first logic approaches very closely the two forward junction voltage drops and has a corresponding variability as a function of temperature.

It is known that a TTL logic family type circuit is characterized by a switching level whose value, which is of the order of 1.3 V, varies with temperature as the two junction voltage drop. Consequently, the translator circuit of FIG. 2 ensures that the desired compatibility of the switching levels as a function of temperature between the two types of logic family circuits is obtained because the switching level at the output remains stable, which is favourable for CML logic. Any other desired variability as a function of temperature could also be simply obtained either by including one or several forward junctions in the series arrangement 23 to increase the variability of the input switching level, or by interposing one or several forward junctions betweens the terminal 24 and the terminal 27, for example, to increase the variability of the output level.

It will now be considered that the potential of the transit terminal increases beyond the switching level to the high state of the first type logic circuit. The emitter current of the transistor T1 increases until it reaches the value I. The current in R is then cancelled and the terminal 27 reaches the high potential state of 0 V. For potentials exceeding that of the transit terminal 22 the semiconductor junction J2 between the conducting state and the high state of the terminal 27 is kept at 0 V. In the high state of the transit terminal 22, the input current of the circuit 10 is limited by the limiter resistor R1.

Figure 3:
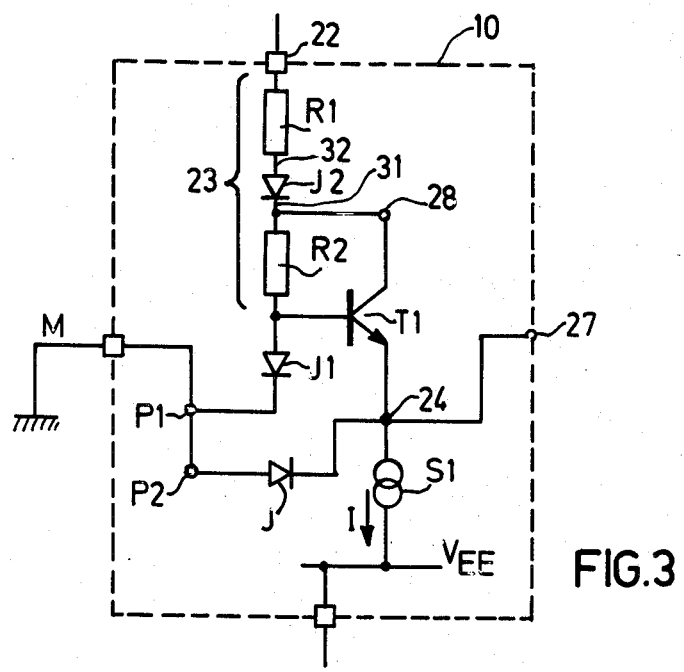
FIG. 3 shows a circuit diagram of a circuit comprising modifications with respect to the embodiment of FIG. 2.

FIG. 3 illustrates a translator circuit analogous to that of FIG. 2, but comprising a few modifications. The elements corresponding to those in FIGS. 1 and 2 are designated by like reference symbols. The circuit of FIG. 3 is distinguished in that, the limiter resistor R1 is connected directly to the transit terminal, the collector of the emitter follower transistor T1 is connected to a first electrode 31 of the semiconductor junction J2, and an additional limiter resistor R2 is included in the series arrangement 23 between the first electrode 31 of the junction J2 and the base of the transistor T1. The second electrode 32 of the junction J2 is connected to the limiter resistor R1. Another modification with respect to FIG. 2 resides in the fact that the load element for the current source S1 is a semiconductor junction J connected in forward direction with respect to this current source.

The circuit of FIG. 3 operates in a manner rather similar to that of the circuit of FIG. 2. When the potential of the transit terminal 22 is in the low state, the transistor T1 is cut off. The current I traverses the junction J producing at the terminal 27 a low state, whose potential is equal to: $(0-V_J)$ volt, $V_J$ designating the forward voltage drop in the junction J traversed by the current I. The value $(V_J)$ represents also the level deviation at the input of the second logic family type circuit, which is 0.7 to 0.8 V depending upon the value of the current I and the characteristics of the junction J which have been chosen.

When the potential of the transit terminal 22 is increased from the low state, an increasing part of the current I is supplied to the emitter of the transistor T1 and the potential of the output terminal 27 increases. When it reaches the value $-V_J/2$, which is defined as switching level for the input of the second logic, it can be simply shown that the part of the current I passing through the junction J is extremely small and the main part of the current I is then supplied by the emitter of the transistor T1. In these conditions, the potential $V_T$ attained at the transit terminal 22 is evaluated approximately by means of the relation (2):

$$V_T \simeq R1.I + V_{J2} + R2.(I/\beta) + V_{BE}(T1) - V_J/2, \quad (2)$$

in which a term of $R1.I/\beta$ has been neglected, the transistor current amplification $\beta = I_E(T1)/I_B(T1)$ being generally high. Resistance values can then be chosen, such as:

$$R1 \simeq V_J/(2.I) - R2/\beta$$

so that the switching level of the first logic family type circuit is again approximately equal to two forward junction voltage drops and implies a corresponding variability as a function of temperature. It is to be noted that the term $V_J/2$ in fact represents a voltage level which should be certainly constant when the temperature varies because it has been chosen as the value of the switching level of the second logic family type circuit. Moreover, it is simple to choose a rather high value of R2 so that the input current at the transit terminal 22 in the high state is considerably reduced with respect to the effect of the resistor R1 used singly (as in the case of the circuit of FIG. 2), which has, however, a value which is not so high at the point at which the switching level at the input of the translator is rendered strongly dependent upon the amplification $\beta$ of the transistor T1. The provision of the additional limiter resistor R2 therefore has the advantage that the input current of the circuit 10 in the high state can be reduced considerably, whilst the value of the resistor R1 remains the main parameter which determines the adjustment of the switching level of the first logic family type circuit. It is clear that the provision of the additional limiter resistor R2, which is considered as a first modification with respect to the circuit diagram of FIG. 2, is a modification which is not connected with the second modification which has consisted in using as load element a junction J instead of a resistor R.

The third modification illustrated in FIG. 3 resides in the choice of the point at which the collector of the transistor T1 has been connected to the series arrangement 23, which differs from that shown in FIG. 2.

Figure 4:
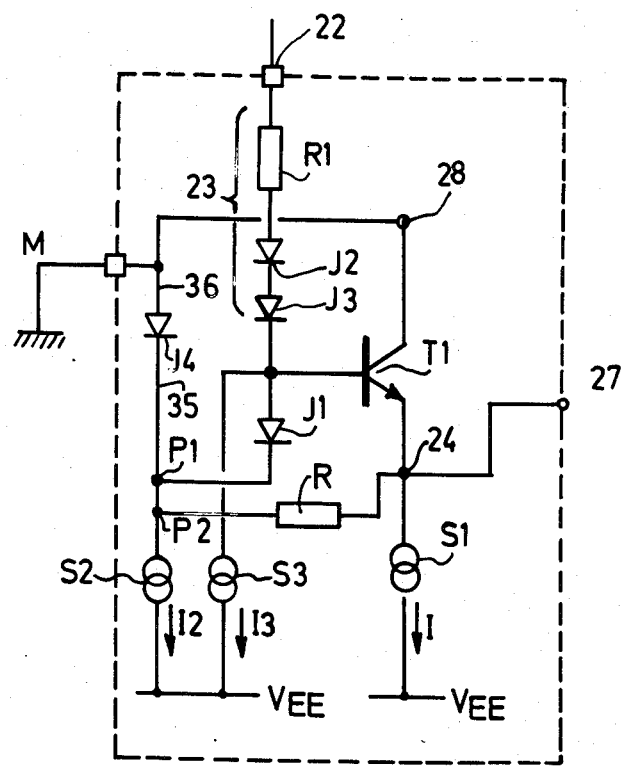
FIG. 4 shows the electric circuit diagram of the translator circuit according to a second embodiment of the invention.

FIG. 4 shows a second embodiment of the translator circuit according to the invention, as defined by the general circuit diagram of FIG. 1. The elements corresponding to those in FIG. 1 are designated by like reference symbols.

The circuit diagram of FIG. 4 is distinguished from the corresponding part of FIG. 1 by the following points:

the points P1 and P2 are connected together to a first electrode 35 of an associated semiconductor junction J4, while the second electrode 36 of this junction is connected to the common reference point M. The junction J4 is subjected to the forward current of an associated current source connected between the first electrode 35 of the junction J4 and the supply line $V_{EE}$.

The current source S2 is chosen to emit a current I2 of a value slightly exceeding that of the current I of the current source S1. Thus, during operation, the junction J4 is always fed, which results in that the points P1 and P2 are constantly at a potential lower than that at the common reference point M. The potential at points P1 and P2 being shifted with a value equal to the value of a voltage drop in forward direction in junctions.

further, the series arrangement 23 comprises two supplementary semiconductor junctions J2 and J3 instead of a single junction, as in FIGS. 1 to 3;

on the other hand, the terminal 28 of the collector of the transistor T1 is connected directly to the common reference point M;

finally, an additional current source S3 is connected between the base of the transistor T1 and the supply line $V_{EE}$. The current source S3 is proportioned so as to supply a current I3 whose value is advantageously chosen to lie between that of I and that of $I/\beta$. The current source S3 may be constituted by a simple base resistor of high value connected to $V_{EE}$.

In the embodiment of FIG. 4, the load element of the current source S1 is a resistor R. The operation of the translator circuit of this embodiment will now be briefly explained: when the transit terminal 22 is in the low state, the transistor T1 is cut off. In fact, the shift of the potential at the base of T1 due to the voltage drop in the junction J4 is compensated for by the supplementary junction J3. Moreover, the current source S3 has the effect to render T1 more strongly non-conducting. The output terminal 27 is in the low state whose potential is equal to $(-V_{J4}-R.I.)$, i.e. a level deviation of the second logic defined by the term R.I., shifted negatively by a forward voltage drop in the junction J4. It is to be noted that due to the shift as a result of $-V_{J4}$ the output signal of the translator 10 will be applied to a stage of the second logic family type circuit, whose other input is subjected to a reference potential likewise shifted negatively by a forward junction voltage drop, as is known from the ECL/CML technique.

When the potential of the transit terminal 22 is increased from the low state, the potential of the base of T1 increases until the base collector path of the transistor T1 starts becoming conducting.

Now the situation is examined for which the current supplied by the emitter of T1 is equal to I/2. The load element at this instant is also traversed by a current equal to I/2. The output terminal is then at a potential level defined as switching level of the second logic family type circuit. The potential $V_T$ then attained via the transit terminal 22 can be evaluated approximately by the expression (3):

$$V_T \approx R1.(I3+1/2\beta)+V_{J2}+V_{J3}+V_{BE}(T1)-R.I./2-V_{J4}, \quad (3)$$

which can be expressed as follows:

$$V_T \approx R1.(I3+1/2\beta)-R.I./2+2.V_J$$

where $V_j$ designates a forward junction voltage drop.

If it is desired, as in the case in which the first logic family type circuit is of the TTL type, that the switching level of this first logic is located at: $V_T \approx 2.V_J$, there is obtained: $R1(2I3/I+1/\beta) \approx R$.

When choosing again the numerical values utilized already in the Example of FIG. 2, i.e. I=0.5 mA, R=800Ω, and when choosing I3=0.1 mA, there is obtained R1≈2 kΩ, the term $1/\beta$ being of minor importance compared with 2I3/I, which is then equal to 0.4.

It is clearly apparent from the foregoing why the presence of the additional current source S3 is advantageous in the cases in which the collector current of the transistor T1 does not traverse the resistor R1, as in this example. In the absence of the current source S3 there would be obtained a value of the resistor R1 which would have to be chosen as a function of the amplification $\beta$ of the transistor T1.

When the potential of the transit terminal 22 is increased towards the level 0 of the first logic family type circuit, the current traversing the resistor R is cancelled and the terminal 27 is brought to the high state of a value equal to $-V_{J4}$. It should be noted that the current consumption at the transit terminal 22 in the high state is reduced with respect to the preceding examples due to the fact that the collector current of T1 is now derived from the common reference point M and that the resistor R1 has a higher value.

Figure 5:
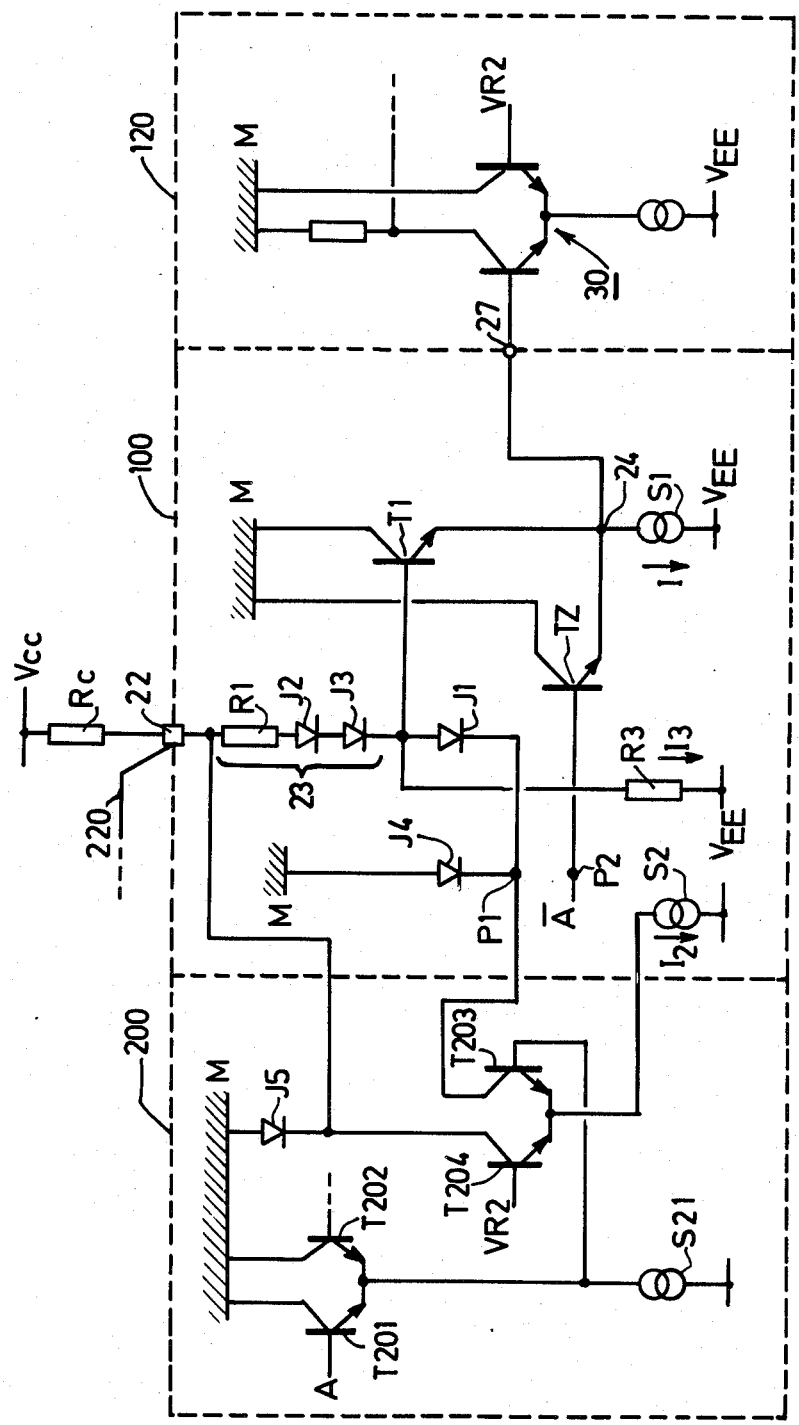
FIG. 5 shows a modification of the circuit diagram of FIG. 4 applied to the case in which the translator circuit according to the invention is utilized for a bidirectional translation of the signals between the two logics.

FIG. 5 shows another embodiment of the translator circuit according to the invention, whose structure is substantially equivalent to that of the embodiment of FIG. 4, but for an application for a bidirectional translation of signals between the two types of logic family. The elements of FIG. 5, which correspond to those of FIG. 4, are designated by like reference symbols as far as they fulfil a similar function.

In this embodiment, the bilateral translation between a TTL logic family type circuit (not shown) whose input or output signals arrive at the transit terminal 22 via the bus 220, and a CML logic family type circuit is considered. The bus 220 is loaded by the resistor $R_C$ connected to $V_{CC}$. The CML logic circuit, within which the translator circuit 100 has been physically integrated, is a logic circuit having a complex function, for example, a prediffused network of gates or a memory. Of this logic circuit only the parts are shown which are relevant to the invention, viz.: a CML input circuit 120 for the input of the signals originating from the TTL logic circuit after translation of the levels by the translator 100 and a CML output circuit 200 for the output of the signals originating from the CML logic circuit and intended for the TTL logic circuit. The transit of these signals is effected by the only transit terminal 22.

The CML output circuit 200 comprises a first long-tailed pair of transistors T201, T202 connected as an "OR" gate for the control of a transistor T203 constituting together with a transistor T204 a second pair.

The collectors of the transistors T201 and T202 are connected to the ground M (common reference point of the two logic circuits). The common conductor of the emitters is connected to $V_{EE}$ via a current source S21 and on the other hand to the base of the transistor T203.

The base of the transistor T204 is brought to a reference potential level $V_{R2}$ of the CML logic circuit, known as "second level", because of its value imposed by the situation of the second pair of transistors with respect to the first pair. The collector of the transistor T204 is connected to the ground M via a forward semiconductor junction J5 and on the other hand to the transit terminal 22. The collector of the transistor T203 is connected to the point P1 of the translator circuit 100, which is connected to the ground M via the semiconductor junction J4 which constitutes the associated semiconductor junction described in the embodiment of FIG. 4. The conductor common to the emitters of the second pair of transistors T203,T204 is connected to $V_{EE}$ via a current source S2 represented within the translator circuit 100, for it fulfils the function of the associated current source S2 of the embodiment of FIG. 4.

There are applied to the base of the transistor T202 signals originating from the CML logic circuit and intended to be transferred as TTL input signals to the bus 220.

The base of the transistor T201 constitutes a first conversion mode selection input which is subjected to a selection signal A.

The translator circuit 100 is analogous to the circuit 10 of FIG. 4 but for a few differences.

In the first place, the load element of the current source S1 is constituted here by a transistor $T_Z$ instead of by a resistor. The load transistor $T_Z$ has the same polarity as the emitter follower transistor T1. Its emitter constitutes what has been designated hereinbefore as the first connection of the load element; its base constitutes the second connection connected to the point P2 which is subjected to a potential of one of the internal CML circuit levels. More precisely, to the point P2 and so to the base of the transistor $T_Z$ there is applied a signal $\overline{A}$ complementary to the mode selection signal A, whose levels are defined with respect to $V_{R1}$, designated as "first level". The base of $T_Z$ consequently constitutes a second mode selection input complementarily controlled with respect to the first selection input.

In the second place, the additional current source is constituted here by a simple additional base resistor R3 of high value replacing the additional current source S3 described in FIG. 4. This resistor R3 is connected between the base of the transistor T1 and $V_{EE}$.

The output terminal 27 of the translator circuit 100 carries signals which, emitted by the TTL logic circuit and after translation, are applied to the input CML circuit 120, of which only the first differential stage 30 has been represented. This stage is otherwise denoted by reference symbol $V_{R2}$, which designates the second level.

The operation of the circuit of FIG. 5 is now described briefly. When the selection signal A is in the high state, the transistor T201 is conducting, the transistor T203 is also conducting and this in a manner independent of the signal applied to the base of the transistor T202. The junction J4 is fed by the current from the current source S2 via the transistor T203. The transistor T204 is cut off; its collector constitutes a high impedance for the transit terminal 22, which is then free to receive via the bus 220 the signals originating from the TTL logic. A selection signal A in the high state is consequently a mode selecting signal: TTL output to CML input.

The signal $\overline{A}$ applied to P2 is then in the low state of the order of $-0.4$ V. If in these conditions the transit terminal 22 is in the low state, the transistor T1 is not conducting. The current I of the current source S1 traverses the load transistor $T_Z$ producing at the terminal 27 a low state whose potential is equal to $(-0.4 - V_{BE(TZ)})$ volt, i.e. about $-1.2$ V. $V_{BE(TZ)}$ designates the emitter-base voltage drop of the load transistor $T_Z$.

When the potential of the transit terminal 22 is increased from the low state, the potential of the base of T1 increases to such an extent that this transistor starts becoming conducting. An increasing part of the current I is supplied by the emitter of T1, which part is deduced from the current traversing the load transistor $T_Z$. The potential of the terminal 27 begins to increase.

When the potential of the terminal 27 will have attained a value equal to $V_{R2}$, the switching level of the first differential stage 30 is obtained. It can be simply checked that in these conditions the residual part of the current I traversing the transistor $T_Z$ is very small with respect to the part of the current I supplied by the transistor T1. Now it is evaluated which is the potential $V_T$ attained via the transit terminal 22, averaging aforementioned approximations, by means of the relation (3):

$$V_T \simeq R1 \cdot (I3 + I/2\beta) + V_{J2} + V_{J3} + V_{BE(T1)} - |V_{R2}|. \tag{3}$$

It is desired that $V_T$ corresponds to the switching level of the TTL logic, i.e. twice the forward voltage drop of a junction. Values are chosen, such as:

$$R1(I3 + I/2\beta) \simeq |V_{R2}| - V_{BE(T1)},$$

but, as is known, the reference potential of the second level $V_{R2}$ corresponds to the sum of a forward voltage drop of a junction and a half deviation of the level of a CML logic circuit. Finally, the choice is made:

$$R1(I3 + I/2\beta) \simeq \tfrac{1}{2} \text{ (deviation of CML logic)}.$$

There can be chose, for example:

$$I = 0.5 \text{ mA}, I3 = 0.1 \text{ mA}$$

which permits of determining the value of the resistor R3. A half deviation of a CML logic circuit being generally approximately equal to 0.2 V, the result is $R1 \simeq 1.90$ k$\Omega$ for an amplification $\beta$ of 50 of the transistor T1 and $R1 \simeq 1.95$ k$\Omega$ for an amplification $\beta$ of 100. It is noted that it is easy to choose values for which the operation of the circuit is very slightly influenced by variations of the amplification of the transistors, so from one group to the other, during the manufacture of circuits according to the invention in integrated form.

When now the potential of the transit terminal 22 is increased beyond the switching level towards the high state of the TTL logic circuit, the load transistor $T_Z$ stops being conducting. The terminal 27 attains a high state fixed by the potential of P1 because the voltage drops $V_{J1}$ and $V_{BE(T1)}$ cancel each other accurately. The high state of the terminal 27 consequently corresponds to a potential of the order of $-0.8$ V imposed by the voltage shift with respect to the mass M due to the junction J4 fed in forward direction.

Now the case is examined in which the mode selection signal A is in the low state. Its complement $\overline{A}$, which is applied to P2. is in the high state equal to approximately 0 V. The load transistor $T_Z$ is conducting and brings the terminal 27 to the high state on which −0.8 V is imposed, which state cannot be modified by the transistor T1 in response to a signal carried by the transit terminal 22. The translator circuit 100 can no longer transmit signals originating from the TTL logic circuit to the CML logic input circuit 120, whose differential stage 30 is cut off in the high state at its input. The signal A in the low state being applied to the base of the transistor T201, the potential of the common conductor of the emitters of the pair of transistors T201, T202 follows the signal of the CML logic circuit applied to the base of the transistor T202, taking into account the shift by one $V_{BE}$.

When in the pair of transistors T203, T204 the transistor T204 is conducting, the current I2 of the current source S2 is derived in part from the transit terminal 22, which is brought to the low state, and for the remaining part from the junction J5 when a value of the current I2 is chosen, which is comparatively high, for example: I2=5 mA. When it is assumed that $R_C$=2.5 kΩ, the transit terminal 22 is brought to a low state of about −0.8 V determined by the voltage drop with respect to the ground terminal M in the junction J5.

At this instant, the transistor T203 does not emit current; the junction J4 is not fed, but the transit terminal 22 being in the low state, the transistor T1 remains cut off.

When now the transistor T203 is conducting, the transistor T204 is cut off. The transit terminal 22 is free to increase to the high state under the influence of the resistor $R_C$ connected to $V_{CC}$. The current I2 of the current source S2 is supplied via the transistor T203 in part by the junction J1 and for the remaining part by the junction J4. At this instant, the transistor T1 operates in the conditions described above, that is to say that, when it is supposed to conduct it would impose on the terminal 27 the same high state of −0.8 V as that fixed already by the load transistor $T_Z$ controlled by the signal $\overline{A}$ in the high state. A selection signal A in the low state is consequently a mode selection signal: CML circuit output to TTL circuit input.

It is clearly apparent from the embodiment described above that modifications are possible without departing from the scope of the invention. By way of example, more particularly the case of the translation of signals between a TTL logic circuit and an ECL/CML logic circuit has been described, which requires the use of npn transistors. Of course, when the polarity of the power supplies is inverted and when pnp transistors are utilized, there would also be obtained a translator circuit satisfying different needs. Otherwise, in the circuit of FIG. 5 there has been described an embodiment which is very economical with regard to the number of elements. It stands to reason that other embodiments of the invention are also possible. The numerical values given by way of example as well as the calculations have been given only to assist those skilled in the art in making the necessary choice of the elements to be used.

What is claimed is:

1. A circuit (10, 100) for translating signal levels between a first logic family type circuit (11) of the saturated type characterized by having two output signal levels and which is driven by a first d.c. supply source (14) of which one terminal (15) constitutes a common reference potential point (M), and a second logic family type circuit (12, 120, 200) of the non-saturated type characterized by having two other output signal levels and which is driven by a second d.c. supply source (20) of which one terminal is connected to the common reference potential point (M) and the other terminal (21) provides a voltage ($V_{EE}$) having a polarity opposite to that of the first d.c. supply source; such translator circuit having a transit terminal (22) for receiving the output signals of the first logic circuit (11) which are to be translated into signals at an output terminal (27) of the translator circuit at a level suitable for the input of the second logic circuit; characterized in that said translator circuit comprises:
    an emitter follower transistor (T1), whose base is connected to a first point (P1) of the circuit at a given potential with respect to that of the common reference point (M) via a first forward semiconductor junction (J1), the base further being connected to the transit terminal (22) via a current-limiting element (23),
    a constant current source (S1) connected between the said other terminal of the second supply source (20) and the emitter of the emitter follower transistor (T1),
    and a load element (Z, R, J, $T_Z$) for the constant current source (S1), of which a first connection (24) is connected to the emitter of the emitter follower transistor and a second connection (25) is connected to a second point (P2) of the circuit at a given potential with respect to that of the common reference point (M),
    the said first connection (24) of the load element constituting the output terminal (27) of the translator circuit for supplying the signals for the input of the second logic circuit, one level of these signals being determined on the basis of the potential of the said second point (P2) of the translator circuit by the voltage drop in the load element (Z, R, J, $T_Z$) traversed by the current (I) of the constant source (S1), the emitter followed transistor (T1) being cut off, while the other level is determined by the potential of the emitter of the emitter follower transistor (T1), the emitter follower transistor (T1) then being conducting.

2. A circuit as claimed in claim 1, characterized in that the base of the emitter follower transistor (T1) is connected to the transit terminal (22) via a series arrangement (23) comprising a current-limiting resistor (R1) and at least one supplementary semiconductor junction (J2) connected in the forward direction.

3. A circuit as claimed in claim 2, characterized in that the said first point (P1) and second point (P2) of the circuit at a defined potential are connected to the common reference potential point (M), and the collector (28) of the emitter follower transistor (T1) is connected to one of the junction points of the said series arrangement (23).

4. A circuit as claimed in claim 3, characterized in that an additional limiter resistor (R2) is included in the said series arrangement (23) between the junction point to which is connected the collector (28) of the emitter follower transistor (T1) and the base of the said transistor.

5. A circuit as claimed in claim 2, characterized in that the said first point (P1) is connected to a first electrode (35) of an associated semiconductor junction (J4) of which the second electrode (36) is connected to the common reference potential point (M); a current source (S2) is connected between the first electrode (35) of the associated semiconductor junction (J4) and the said other terminal ($V_{EE}$) of the second supply source, thereby subjecting the associated semiconductor junction to a forward current (I2); and the said series arrangement (23) comprises two semiconductor junctions (J2,J3).

6. A circuit as claimed in claim 5, characterized in that the collector (28) of the emitter follower transistor (T1) is connected to the common reference potential point (M).

7. A circuit as claimed in one of claims 2 to 6, characterized in that an additional current source (S3) is provided by connection of an additional base resistor (R3) between the base of the emitter follower transistor (T1) and the second supply source.

8. A circuit as claimed in claim 5, characterized in that the said second point (P2) of the circuit is connected to the first point (P1) of the circuit.

9. A circuit as claimed in claim 5, characterized in that said load element (Z) is constituted by a transistor ($T_Z$) having the same polarity as the emitter follower transistor; the emitter of the transistor $T_Z$ constituting the said first connection, the base thereof constituting the said second connection which is subjected to the potential of one of the internal levels of the second logic circuit, and the collector thereof being connected to the common reference potential point (M).

10. A circuit as claimed in claim 9, in which the transit terminal (22) can moreover receive for a transfer to the first logic circuit signals originating from an output circuit (200) of the second logic circuit; the second logic circuit comprises a first long-tailed pair of transistors (T201,T202) connected as an "OR" gate for the control of a first transistor (T203) of a second long-tailed pair of transistors (T203,T204); the base of one of the first pair of transistors (T201) constitutes a first conversion selection unit, the base of the other of the first pair of transistors receives the signals of the second logic circuit, the connection between the collector of the first transistor (T203) of the second pair and the common reference point (M) includes a semiconductor junction which constitutes the said associated semiconductor junction (J4); and a current source feeding the second pair constitutes the said associated current source (S2); the collector of the second transistor (T204) of the second pair being connected to the common reference point (M) via a forward semiconductor junction (J5) and being further connected to the transit terminal (22); the base of the load transistor ($T_Z$) constituting a second selection input controlled complementarily with respect to the first selection input.

11. A circuit as claimed in claim 2, characterized in that the load element (Z) is a resistor (R).

12. A circuit as claimed in claim 2, characterized in that said load element is constituted by a semiconductor junction (J) connected in the forward direction with respect to the constant current source (S1).

* * * * *